(12) United States Patent
Kim

(10) Patent No.: US 7,601,589 B2
(45) Date of Patent: Oct. 13, 2009

(54) METHOD OF MANUFACTURING FLASH MEMORY DEVICE

(75) Inventor: Jae Heon Kim, Icheon-si (KR)

(73) Assignee: Hynix Semiconductor Inc., Icheon-Si (KR)

( * ) Notice: Subject to any disclaimer, the term of this patent is extended or adjusted under 35 U.S.C. 154(b) by 119 days.

(21) Appl. No.: 11/454,594

(22) Filed: Jun. 16, 2006

(65) Prior Publication Data

US 2007/0059884 A1  Mar. 15, 2007

(30) Foreign Application Priority Data

Sep. 15, 2005  (KR)  ............ 10-2005-0086189

(51) Int. Cl.
*H01L 21/336* (2006.01)
(52) U.S. Cl. ............ 438/257; 257/315; 257/E21.68
(58) Field of Classification Search ............ 438/257, 438/93; 257/E27.091, E21.546, E21.687, 257/E21.688, 314–315
See application file for complete search history.

(56) References Cited

U.S. PATENT DOCUMENTS

| | | | | |
|---|---|---|---|---|
| 3,775,274 | A * | 11/1973 | Rust et al. | 205/717 |
| 5,496,750 | A * | 3/1996 | Moslehi | 438/297 |
| 5,605,603 | A * | 2/1997 | Grimard et al. | 438/715 |
| 5,963,816 | A * | 10/1999 | Wang et al. | 438/401 |
| 6,284,597 | B1 * | 9/2001 | Hong | 438/257 |
| 6,284,637 | B1 * | 9/2001 | Chhagan et al. | 438/594 |
| 6,461,923 | B1 * | 10/2002 | Hui et al. | 438/305 |
| 6,503,799 | B2 * | 1/2003 | Horita et al. | 438/269 |
| 6,825,526 | B1 * | 11/2004 | He et al. | 257/317 |
| 2002/0092546 | A1 * | 7/2002 | Twu et al. | 134/36 |
| 2004/0157403 | A1 * | 8/2004 | Han et al. | 438/424 |
| 2004/0157444 | A1 * | 8/2004 | Chiu et al. | 438/689 |
| 2005/0040475 | A1 * | 2/2005 | Jang et al. | 257/396 |
| 2006/0118861 | A1 * | 6/2006 | Van Schaijk et al. | 257/330 |
| 2006/0187711 | A1 * | 8/2006 | Jang | 365/185.15 |
| 2007/0049040 | A1 * | 3/2007 | Bai et al. | 438/712 |

FOREIGN PATENT DOCUMENTS

KR  1020010053905  7/2001

* cited by examiner

*Primary Examiner*—Lex Malsawma
*Assistant Examiner*—Kimberly Trice
(74) *Attorney, Agent, or Firm*—Marshall, Gerstein & Borun LLP

(57) ABSTRACT

The invention provides a method of manufacturing a flash memory device. Nitride film spacers are formed on sidewalls of protruded isolation films. A recess is formed in a semiconductor substrate by a self-aligned etch process using the nitride film spacers as masks. It is therefore possible to form a uniform recess over the entire wafer. Furthermore, a floating gate is formed on the semiconductor substrate including the recess in a self-aligned manner. Accordingly, a contact area between the floating gate and the semiconductor substrate can be increased as large as a recess surface area.

30 Claims, 5 Drawing Sheets

METHOD OF MANUFACTURING FLASH MEMORY DEVICE

BACKGROUND

1. Field of the Invention

The invention relates generally to a method of manufacturing semiconductor devices and, more particularly, to a method of manufacturing a flash memory device.

2. Discussion of Related Art

In general, the isolation film and the floating gate of a flash memory device are formed through the mask process. As the flash memory device is reduced, however, the overlay margin between a mask for the isolation film and a mask for the floating gate is reduced in size. The reduction in the overlay margin results in the generation of gate short failures between neighboring floating gates.

Furthermore, such a reduction in the overlay margin may generate cycling failures due to stress by the device driving without direct contact because the isolation film and the dielectric layer formed on the floating gate may be formed very closely.

In addition, in implementing NAND flash memory devices of 70 nm or less, the width of the floating gate formation region, which affects the cell current, also becomes reduced in size as the size of the cell pattern is reduced. It is therefore difficult to maintain an adequate level of cell current.

If the formation region width of the floating gate is increased within a limited area in a two-dimensional way in order to supplement these aspects, the width of a trench in which the isolation film will be formed is reduced in size much as the increased width. Consequently, since a gap-fill margin becomes small in the gap-fill process of the trench, there is a problem in that voids may occur in the isolation film.

SUMMARY OF THE INVENTION

In one embodiment, the invention provides a method of manufacturing a flash memory device, in which a region in which a floating gate is formed can be increased in size within a limited area without reducing a gap-fill margin of an isolation film.

In another embodiment the invention provides a method of manufacturing a flash memory device, which can prevent an overlay margin between a mask for an isolation film and a mask for a floating gate from reducing in size.

A method of manufacturing a flash memory device according to a first aspect of the invention includes the steps of forming trenches for isolation films in a semiconductor substrate; forming the isolation films, which protrude upwardly from the semiconductor substrate, in the trenches; forming nitride film spacers on sidewalls of the protruding isolation films; forming a recess in the semiconductor substrate by means of an etch process using the nitride film spacers as masks; stripping the nitride film spacers; forming a tunnel oxide film on the semiconductor substrate in which the recess is formed; and, forming floating gate films on the tunnel oxide film, whereby a contact area between the floating gate films and the semiconductor substrate is increased by means of the recess.

Furthermore, a method of manufacturing a flash memory device according to a second aspect of the invention includes the steps of: sequentially forming an oxide film, a nitride film, an amorphous carbon film, a SiON film, and an O-BARC film on a semiconductor substrate, thereby forming a hard mask layer; forming photoresist patterns on the O-BARC film, and sequentially etching and patterning the O-BARC film, the SiON film, the amorphous carbon film, the nitride film, and the oxide film; etching the semiconductor substrate exposed by the etch process, thus forming trenches for device isolation; stripping the patterned amorphous carbon film; forming isolation films within the trenches; stripping the patterned nitride film whereby the isolation films protrude; forming nitride film spacers on sidewalls of the protruded isolation films; forming a recess in the semiconductor substrate by an etch process using the nitride film spacers as masks; stripping the nitride film spacers; forming a tunnel oxide film on the semiconductor substrate in which the recess is formed; and, forming floating gate films on the tunnel oxide film, whereby a contact area between the floating gate films and the semiconductor substrate is increased by means of the recess.

BRIEF DESCRIPTION OF THE DRAWINGS

A more compete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

Figure 1:
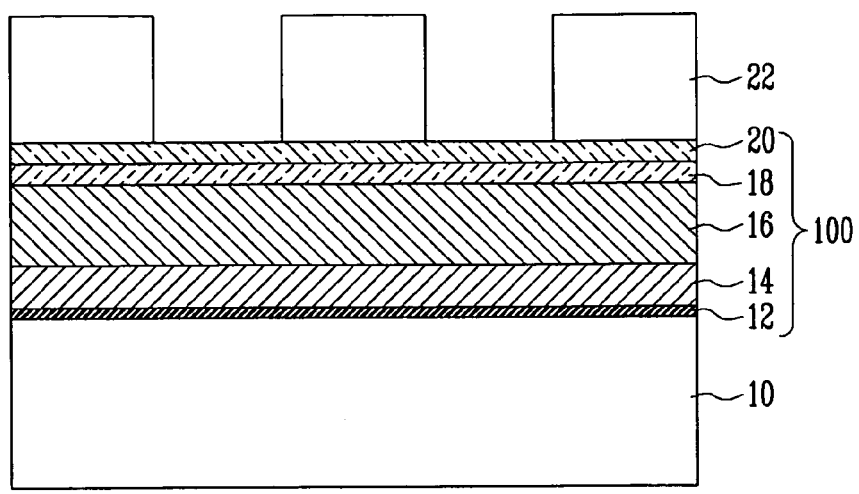
FIGS. 1 to 17 are cross-sectional views illustrating a method of manufacturing a flash memory device according to an embodiment of the present invention.

The invention is described in detail below in connection with certain exemplary embodiments with reference to the accompanying drawings. To clarify multiple layers and regions, the thickness of the layers is enlarged in the drawings. Furthermore, when it is said that any part, such as a layer, film, area, or plate, is positioned on another part, it means the part is directly on the other part or above the other part with at least one intermediate part. On the other hand, if any part is said to be positioned directly on another part it means that there is no intermediate part between the two parts.

FIGS. 1 to 17 are cross-sectional views illustrating a method of manufacturing a flash memory device according to an embodiment of the invention.

Referring to FIG. 1, an oxide film 12, a first nitride film 14, an amorphous carbon film 16, a SiON film 18, and an O-BARC film 20 are sequentially formed on a semiconductor substrate 10, forming a hard mask layer 100. Photoresist patterns 22 having regions through an isolation film will be opened are formed on the O-BARC film 20 of the hard mask layer 100.

The oxide film 12 may preferably have a thickness of 70 Å to 90 Å, which can prevent stress applied to the semiconductor substrate 10 by the first nitride film 14. The oxide film 12 may preferably be a pad oxide film that is formed through an additional process, or a screen oxide film applied in a threshold voltage ion implantation process of the processes of the flash memory device.

The first nitride film 14 may preferably be formed to a thickness of 1500 Å or more, preferably 1500 Å to 1700 Å. The thickness of the first nitride film 14 is only a thickness of a polysilicon layer for a floating gate to be formed layer, which may remain after CMP to a thickness of 700 Å or more. The first nitride film 14 may be formed to different thickness depending on process conditions and devices to be implemented.

The amorphous carbon film 16, the SiON film 18, and the O-BARC film 20 may have a thickness dependent on process conditions and devices to be implemented. Therefore, in the invention, the thickness of the amorphous carbon film 16, the SiON film 18, and the O-BARC film 20 will not be numerically limited. The photoresist patterns 22 are formed using a resist for KrF.

Figure 2:
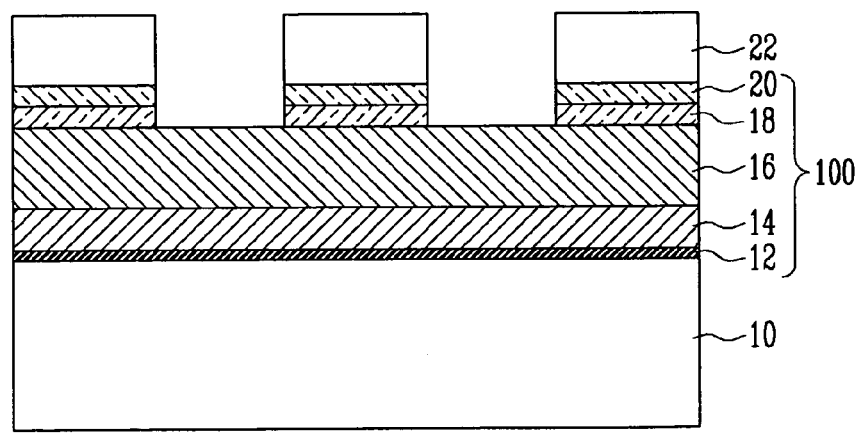

Referring to FIG. 2, the O-BARC film 20 and the SiON film 18 are etched using the photoresist patterns 22 as an etch mask.

The O-BARC film 20 and the SiON film 18 are films, which are used for a mask DOF (Depth of Focus) when the photoresist patterns 22 are formed.

The etch process of the O-BARC film 20 may preferably be performed using a mixed gas of a $CF_4$ gas, a $CHF_3$ gas, and an $O_2$ gas. The etch process of the SiON film 18 may preferably be performed using a mixed gas of a $CF_4$ gas and a $CHF_3$ gas. While the O-BARC film 20 and the SiON film 18 are etched using the etch gases, the photoresist patterns 22 are stripped by a given thickness.

Figure 3:
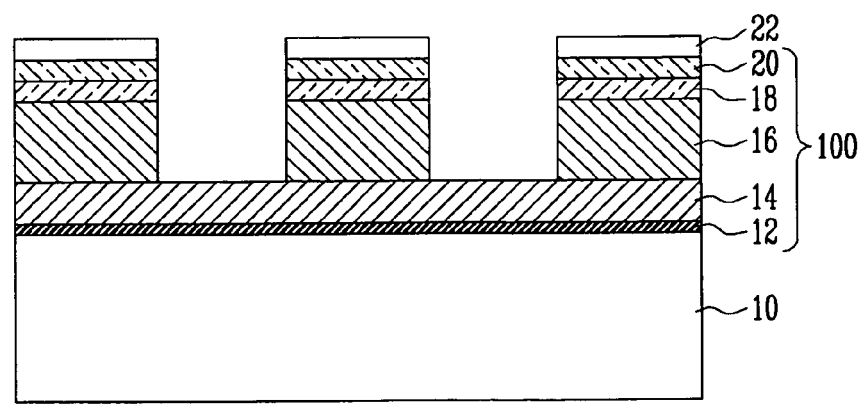

Referring to FIG. 3, the amorphous carbon film 16 is etched using the photoresist patterns RP as etch masks.

The etch process of the amorphous carbon film 18 may preferably be performed using a mixed gate of a CO gas and a $N_2$ gas, or a mixed gas of $NH_3$ gas and an $O_2$ gas. While the amorphous carbon film 18 is etched using the etch gases, the photoresist patterns 22 is significantly stripped.

Figure 4:
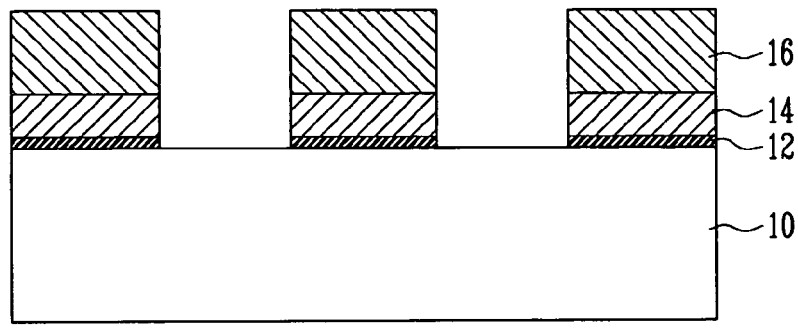

Referring to FIG. 4, the first nitride film 14 and the oxide film 12 are etched using the photoresist patterns 22 that partially remains, the O-BARC film 20, the SiON film 18, and the amorphous carbon film 16 as etch masks.

The etch process of the first nitride film 14 may preferably be performed using a mixed gas of a $CF_4$ gas, a $CHF_3$ gas, an $O_2$ gas, and an Ar gas. While the first nitride film 14 is etched using the gases, the photoresist patterns 22, the O-BARC film 20, and the SiON film 18 on the amorphous carbon film 16 are naturally stripped. The oxide film 12 that has been exposed through the etching of the first nitride film 14 has a thin thickness to the extent that it can prevent the stress of the semiconductor substrate 10, which is caused by the nitride film, as described above. Accordingly, although the oxide film 12 is not stripped by an additional oxide film stripping process, it can be stripped when stripping the first nitride film 14. Furthermore, although the oxide film 12 is not fully stripped, it does not have a great influence on subsequent processes.

Figure 5:
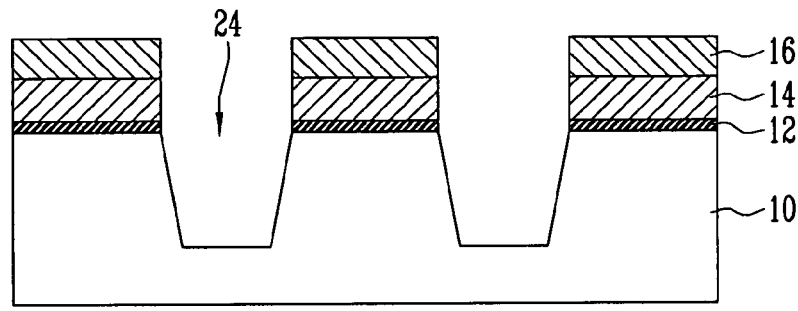

Referring to FIG. 5, the semiconductor substrate 10 is etched by a given depth using the amorphous carbon film 16 as an etch mask, thereby forming trenches 24 for isolation films.

The etch process of the semiconductor substrate 10 may preferably be performed using a mixed gas of a HBr gas and an $O_2$ gas such that the slope angle of the trench etch profile is kept to 86 degrees or less. Since the trenches 24 are formed to have an inclined etch profile as described above, it is possible to prevent the occurrence of void within the trenches during the trench burial process. While the trenches 24 are formed using these gases, the amorphous carbon film 16 is partially stripped.

Figure 6:
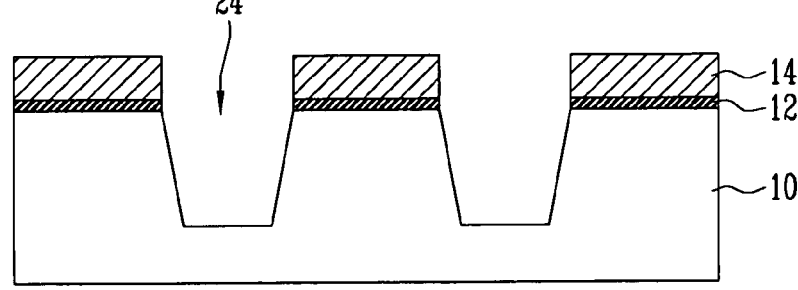

Referring to FIG. 6, the amorphous carbon film 16 remaining after the formation process of the trenches 24 is stripped.

The physical property of amorphous carbon is easily removed by the photoresist strip process. Therefore, the amorphous carbon film 16 is stripped by the photoresist strip process.

As mentioned above with reference to FIGS. 1 to 6, the oxide film 12, the first nitride film 14, the amorphous carbon film 16, the SiON film 18, and the O-BARC film 20 are used as the hard mask layer 100 in order to form the trenches 24.

When forming a given pattern, the photoresist patterns are generally used. However, as the device become higher integrated and miniaturized, minute patterns are required to be formed. Hard mask layers having various structures are used along with the photoresist patterns since it is impossible to form the minute patterns only with the photoresist patterns.

The hard mask layer 100 according to the invention has the following characteristics. The amorphous carbon film 16 serves as a the hard mask when etching the first nitride film 14. It is thus possible to obtain the first nitride film 14 having a preferable pattern shape. The amorphous carbon film 16 also has a property that it is easily stripped through a generalized photoresist strip process in the semiconductor manufacture process. This facilitates the strip process of the amorphous carbon film 16.

The SiON film 18 and the O-BARC film 20 functions to improve the mask DOF when forming the photoresist patterns 22. It is thus possible to form the photoresist patterns 22 having a preferable pattern shape. The SiON film 18 and the O-BARC film 20 are naturally stripped along with the photoresist patterns 22 during a sequential process. It is therefore possible to exclude an additional strip process. Furthermore, the etch process can be performed in-situ from the O-BARC film 20 to the first nitride film 14 in the same etch equipment using the above-mentioned etch scheme.

Figure 7:
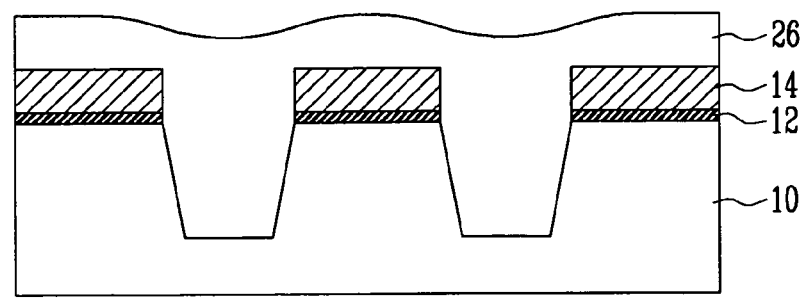

Referring to FIG. 7, an insulating layer 26 is formed on the resulting surface in which the trenches 24 have been formed so that the trenches 24 are buried. The insulating layer 26 is formed using a high density plasma (HDP) oxide film in order to prohibit the occurrence of void within the trenches 24. Furthermore, the insulating layer 26 can be preferably formed without the occurrence of void since the trenches 24 are formed to have the inclined etch profile.

Figure 8:
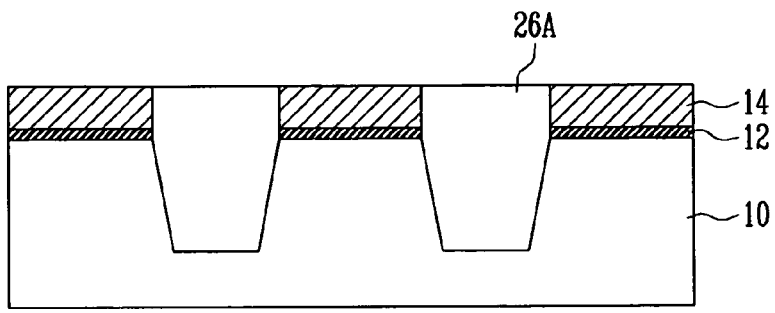

Referring to FIG. 8, the insulating layer 26 is polished by chemical mechanical polishing (CMP) until the first nitride film 14 is exposed, thereby forming isolation films 26A of an isolated shaped only within the trenches 24.

Figure 9:
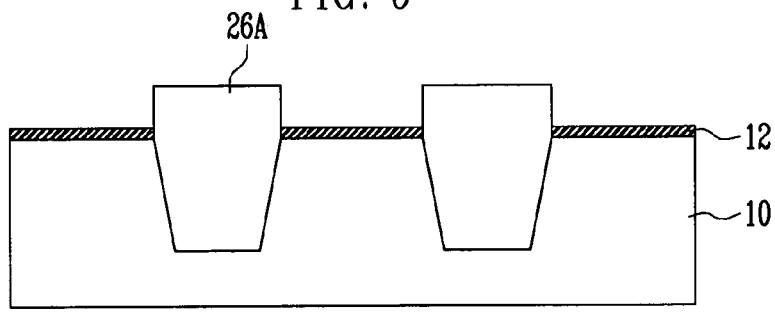

Referring to FIG. 9, the exposed first nitride film 14 is stripped by a first nitride film etch process.

The first nitride film etch process may preferably be performed using a wet chemical solution containing $NH_3F+HF$ and $H_3PO_4$. The oxide film 12 has been experienced etch damage during the first nitride film etch process, but serves to protect the semiconductor substrate 10 from etch damage. The isolation films 26A are projected upwardly from the semiconductor substrate 10 as high as the height of the first nitride film 14 due to the removal of the first nitride film 14.

Figure 10:
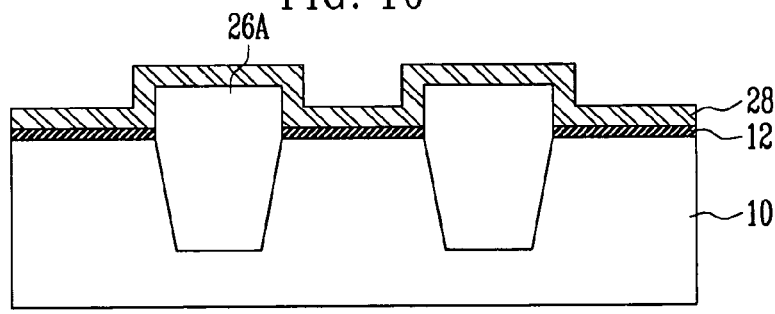

Referring to FIG. 10, a second nitride film 28 is formed on the resulting surface including the protruded isolation films 26A. The second nitride film 28 is formed more thickly on the protruded isolation films 26A than on the groove portions between the protruded isolation films 26A in terms of its deposition characteristic.

Figure 11:
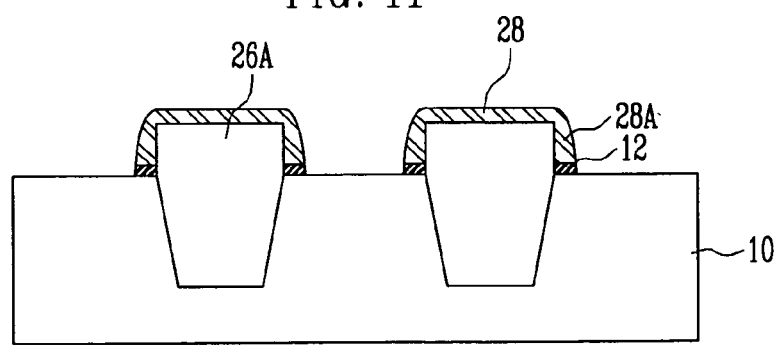

Referring to FIG. 11, the second nitride film 28 and the oxide film 12 are etched through a spacer etch process, thus forming nitride film spacers 28A on the sidewalls of the protruded isolation films 26A.

The spacer etch process may preferably be performed in an oxide etch equipment using an etchant having a high etch selectivity of nitride and oxide against silicon (Si) constituting the semiconductor substrate 10, such as a mixed gas of a $CF_4$ gas, a $CHF_3$ gas, an $O_2$ gas, and an Ar gas, in order to minimize etch loss of the semiconductor substrate 10 and uniformly form the nitride film spacers 28A. The second nitride films 28 on the top surface of the protruded isolation films 26A are thicker than other portions and remain after the spacer etch process is completed. Due to this, the isolation films 26A are not etched and lost.

Figure 12:
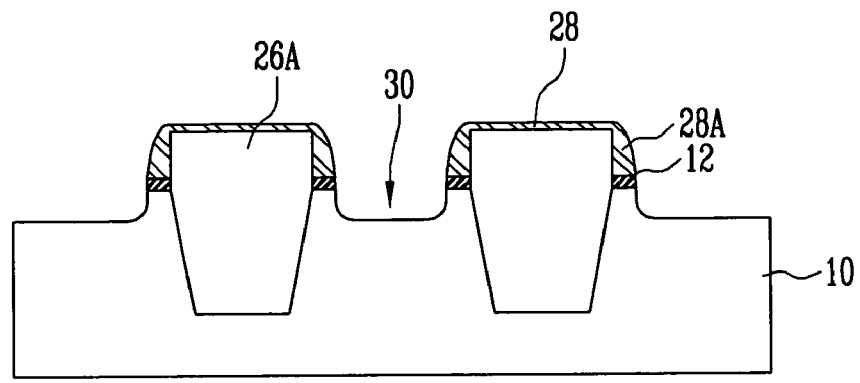

Referring to FIG. 12, a recess 30 is formed at the center of the active region of the semiconductor substrate 10 by performing a self-aligned etch process using the nitride film spacers 28A as etch mask.

The self-aligned etch process may preferably be performed in a polysilicon etch equipment using an etchant having a low etch selectivity of nitride and oxide against silicon (Si) constituting the semiconductor substrate 10, such as a mixed gas of a $Cl_2$ gas and a HBr gas, in order to make a depth and width of the recess 30 uniform over the entire wafer while maintaining the shape of the nitride film spacers 28A serving as the etch masks to its original state.

To remove polymer generated during the self-aligned etch process and recover the surface of the semiconductor substrate 10 at the etch-damaged portion of the recess 30, a post etch treatment (PET) process may be performed after the self-aligned etch process.

If a typical dry etch process is performed, a variety of reactants may be creased through the reaction between the etch gas and the etched film. Polymer residue of the created reactants must be removed by the PET process.

In the silicon substrate after the etch process is performed, surface lattices of silicon have been damaged. If the PET process is performed on the silicon substrate on which the etch process has been performed, the surface of the silicon substrate can be recovered by oxidizing or removing the damaged portion.

As described above with reference to FIGS. 11 and 12, the recess 30 is formed in the active region through the spacer etch process and the self-aligned etch process. It is therefore possible to increase the formation region of the floating gate without reducing the gap-fill margin of the isolation films within a limited area.

The recess 30 formed by the processes is located at the center of the active region and also has a uniform depth and a uniform width over the entire waver. It is important to form the uniform recess 30 over the entire waver. The reason will be described later.

Figure 13:
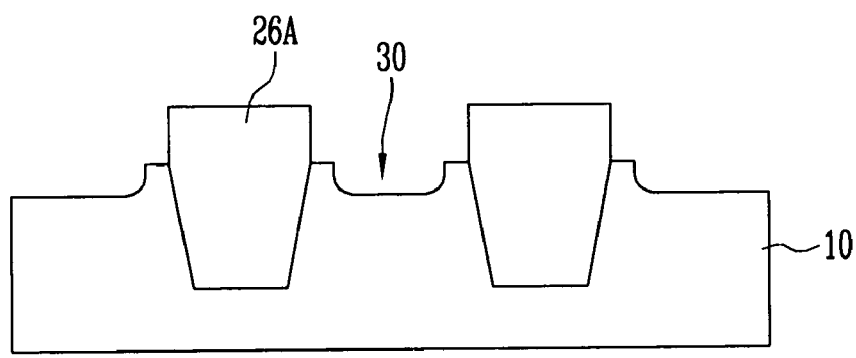

Referring to FIG. 13, the nitride film spacers 28A and the second nitride films 28 remaining on the isolation films 26A are stripped through a second nitride film etch process.

The second nitride film etch process may preferably be performed using a wet chemical solution containing $NH_3F+HF$ and $H_3PO_4$. The oxide film 12 was lost by a given thickness in the first nitride film etch process and is naturally stripped while being lost in the second nitride film etch process. The oxide film 12 can be sufficiently stripped by a post-cleaning process performed after a typical etch process, a pre-cleaning process performed after a deposition process, and the like even if it is not fully stripped during the second nitride film etch process.

Figure 14:
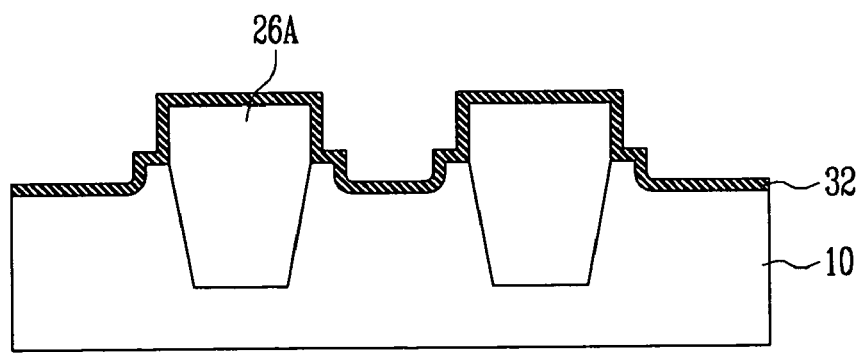

Referring to FIG. 14, a tunnel oxide film 32 is formed on the semiconductor substrate 10 in which the recess 30 is formed.

Figure 15:
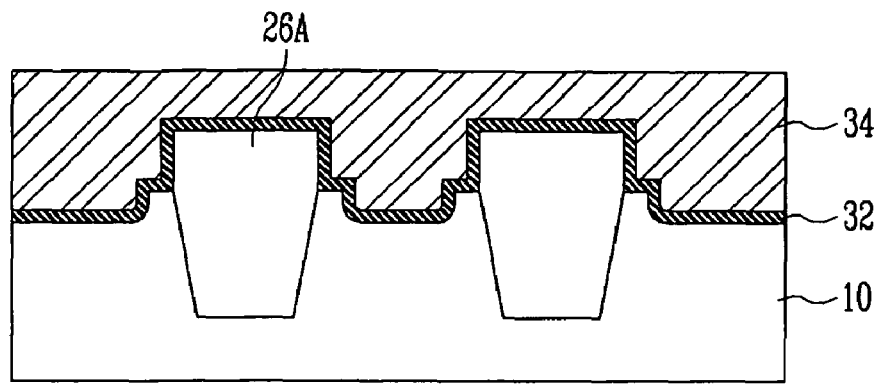

Referring to FIG. 15, a polysilicon layer 34 is formed on the resulting surface on which the tunnel oxide film 32 is formed. The polysilicon layer 34 is formed to a thickness enough to cover the protruded isolation films 26A as well as the recess 30.

Figure 16:
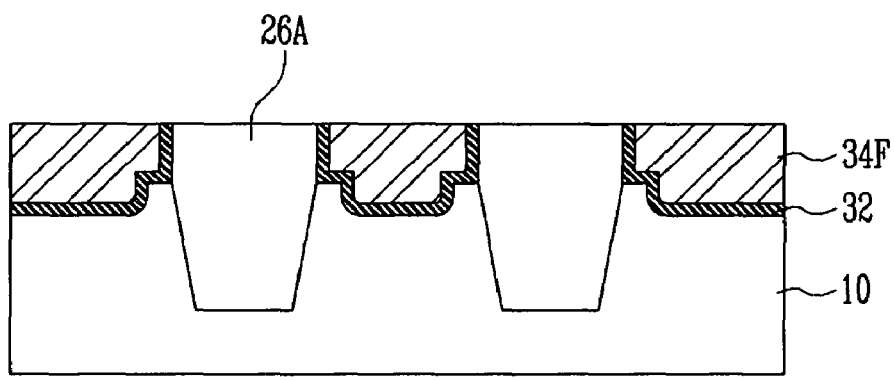

Referring to FIG. 16, a CMP process is performed on the polysilicon layer 34 until the top surfaces of the isolation films 26A are sufficiently exposed, thereby forming floating gate films 34F of an isolated shape between the protruded isolation films 26A.

The floating gate films 34F of the isolated shape must be formed to a thickness of 700 Å or more. The thickness depends on the thickness of the first nitride film 14. In other words, the CMP process must be sufficiently performed on the polysilicon layer 34 in order to make the floating gate 34F have the isolated shape. Accordingly, in order for the floating gate films 34F of the isolated shape to have a thickness of 700 Å or more, the first nitride film 14 must have a thickness of at least 1500 Å.

Figure 17:
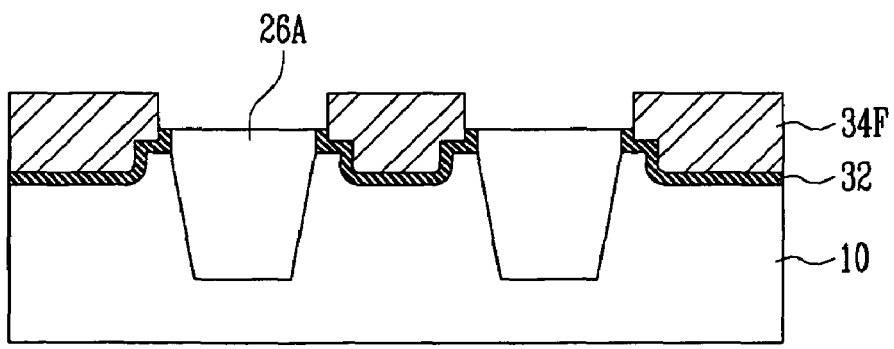

Referring to FIG. 17, the projected portions of the isolation films 26A between the floating gate films 34F of the isolated shape are stripped using an oxide film etch process. Therefore, the isolation films 26A are completed and the floating gate films 34F of the projected structure, having an increased surface area, are completed accordingly. Though not shown in the drawings, constituent elements of the device, such as a dielectric layer and a control gate, are formed to complete the flash memory device.

The oxide film etch process may be performed using a wet etch method so that the effective field oxide height (EFH) of a uniform thickness over the entire wafer can be secured in such a manner that the isolation films 26A is uniformly stripped over the wafer. During the oxide film etch process, the thickness of the EFH is maintained to 150 Å or more from the tunnel oxide film 32. It is therefore possible to prevent cycling test fail, which may occur upon repetitive driving test of the device.

Furthermore, the oxide film etch process may be performed using a wet chemical solution of $H_2O+HF$ and $NH_4OH+H_2O_2+H_2O$, or may be performed using a wet chemical solution in a pre-cleaning process, which is performed before the process of forming the dielectric layer after the floating gate films 34F are formed, in order to shorten the process.

As described above with reference to FIGS. 15 to 17, the floating gate films 34F are formed in a self-aligned manner without a mask process. Accordingly, it is unnecessary to consider overlay margin between the floating gate films 34F and the isolation films 26A. In addition, since the contact area the floating gate films 34F and the semiconductor substrate 10 is increased due to the recess 30, a proper level of a cell current can be secured even if the size of a cell pattern becomes small.

Furthermore, since the floating gate films 34F are formed on the recess 30, there may be a problem in that the characteristic of the floating gate films 34F are changed if the recess 30 is irregularly formed depending on the location of a wafer. This is because the recess 30 is formed uniformly over the entire wafer, as described above with reference to FIGS. 11 and 12.

As described above, according to the invention, by forming a uniform recess in a self-aligned manner, the width of the region in which the floating gate is formed can be increased within a limited area. In addition, by forming the floating gate in a self-aligned manner, flash memory devices of 70 nm or less can be easily implemented although overlay margin with an isolation films is taken into consideration.

While the invention has been described in connection with practical exemplary embodiments, the invention is not limited to the disclosed embodiments, but, on the contrary, is intended to cover various modifications and equivalent arrangements included within the spirit and scope of the appended claims.

What is claimed is:

1. A method of manufacturing a flash memory device, the method comprising:

forming trenches for isolation films in a semiconductor substrate;

forming isolation films, which partially protrude upwardly from the semiconductor substrate and define sidewalls, in the trenches;

forming nitride film spacers on a top surface and sidewalls of the protruding isolation films;

etching the semiconductor substrate by an etch process using the nitride film spacers as masks, thereby forming a recess in the semiconductor substrate;

stripping the nitride film spacers;

forming a tunnel oxide film on the semiconductor substrate in which the recess is formed;

forming floating gate films on the tunnel oxide film, whereby the size of a contact area between the floating gate films and the semiconductor substrate is increased by means of the recess; and stripping the projected portions of the isolation films after forming the floating gate films.

2. The method of claim 1, wherein the oxide film is a screen oxide film for injecting threshold voltage ions.

3. The method of claim 1, comprising forming the trenches by an etch process using mixed gas comprising HBr gas and $O_2$ gas such that an inclined angle of a trench etch profile is maintained to 86 degrees or less.

4. The method of claim 1, comprising forming the nitride film spacers by forming a nitride film on the resulting surface including the protruded isolation films and then performing a spacer etch process.

5. The method of claim 4, comprising performing the spacer etch process in oxide etch equipment using a mixed gas comprising $CF_4$ gas, $CHF_3$ gas, $O_2$ gas, and Ar gas.

6. The method of claim 1, comprising forming the recess at the center of an active region of the semiconductor substrate by performing a self-aligned etch process using the nitride film spacers as etch masks.

7. The method of claim 6, comprising performing the self-aligned etch process in polysilicon etch equipment using a mixed gas comprising $Cl_2$ gas and HBr gas.

8. The method of claim 1, further comprising a post etch treatment (PET) process after the etch process of forming the recess.

9. The method of claim 1, comprising stripping the nitride film spacers using a wet chemical solution containing $NH_3F+HF$ and $H_3PO_4$.

10. The method of claim 1, comprising forming the floating gate films by a self-aligned method in which a polysilicon layer is formed on the resulting surface in which the tunnel oxide film is formed and polishing the polysilicon layer by a chemical mechanical polishing (CMP) process until top surfaces of the isolation films are sufficiently exposed.

11. The method of claim 1, comprising performing the process of stripping the projected portions of the isolation films using a wet chemical solution of $H_2O+HF$ and $NH_4OH+H_2O_2+H_2O$.

12. A method of manufacturing a flash memory device, the method comprising:

sequentially forming an oxide film, a nitride film, an amorphous carbon film, an SiON film, and an O-BARC film on a semiconductor substrate, thereby forming a hard mask layer;

forming photoresist patterns on the O-BARC film, and sequentially etching and patterning the O-BARC film, the SiON film, the amorphous carbon film, the nitride film, and the oxide film;

etching the semiconductor substrate exposed by the etch process, thus forming trenches for device isolation;

stripping the patterned amorphous carbon film;

forming isolation films defining sidewalls within the trenches;

stripping the patterned nitride film whereby the isolation films protrude;

forming nitride film spacers on a top surface and sidewalls of the protruded isolation films;

etching the semiconductor substrate by an etch process using the nitride film spacers as masks, thereby forming a recess in the semiconductor substrate;

stripping the nitride film spacers; forming a tunnel oxide film on the semiconductor substrate in which the recess is formed;

forming floating gate films on the tunnel oxide film, whereby a contact area between the floating gate films and the semiconductor substrate is increased by means of the recess; and stripping the projected portions of the isolation films after forming the floating gate films.

13. The method of claim 12, wherein the oxide film is a screen oxide film for injecting threshold voltage ions.

14. The method of claim 12, comprising performing the etch process of the O-BARC film using a mixed gas comprising $CF_4$ gas, $CHF_3$ gas, and $O_2$ gas using the photoresist patterns as etch masks, and during the etch process, stripping the photoresist patterns to a desired thickness.

15. The method of claim 12, comprising performing the etch process of the SiON film using a mixed gas comprising $CF_4$ gas and $CHF_3$ gas using the photoresist patterns as etch masks, and during the etch process, stripping the photoresist patterns by a desired thickness.

16. The method of claim 12, comprising performing the etch process of the amorphous carbon film using a mixed gas comprising CO gas and $N_2$ gas, or a mixed gas comprising $NH_3$ gas and $O_2$ gas using the photoresist patterns as etch masks, and during the etch process, stripping the photoresist patterns to a desired thickness.

17. The method of claim 12, comprising performing the etch process of the nitride film using a mixed gas comprising $CF_4$ gas, $CHF_3$ gas, $O_2$ gas, and Ar gas, and during the etch process, exposing the oxide film by etching the photoresist patterns on the patterned amorphous carbon film, the patterned O-BARC film, the patterned SiON film, and stripping the nitride film.

18. The method of claim 12, comprising forming the trenches by an etch process using the patterned amorphous carbon film as an etch mask.

19. The method of claim 12, comprising forming the trenches by an etch process using a mixed gas comprising HBr gas and $O_2$ gas such that an inclined angle of a trench etch profile is maintained to 86 degrees or less.

20. The method of claim 12, comprising stripping the patterned amorphous carbon film by a photoresist strip process.

21. The method of claim 12, comprising performing the process of sequentially etching the O-BARC film, the SiON film, the amorphous carbon film, and the nitride film in-situ in the same etch equipment.

22. The method of claim 12, comprising stripping the patterned nitride film using a wet chemical solution containing $NH_3F+HF$ and $H_3PO_4$.

23. The method of claim 12, comprising forming the nitride film spacers by forming a nitride film on the resulting surface including the protruded isolation films and then performing a spacer etch process.

24. The method of claim 23, comprising performing the spacer etch process in oxide etch equipment using a mixed gas comprising $CF_4$ gas, $CHF_3$ gas, $O_2$ gas, and Ar gas.

25. The method of claim 12, comprising forming the recess at the center of an active region of the semiconductor substrate by performing a self-aligned etch process using the nitride film spacers as etch masks.

26. The method of claim 25, comprising performing the self-aligned etch process in polysilicon etch equipment using a mixed gas comprising $Cl_2$ gas and HBr gas.

27. The method of claim 12, further comprising a post etch treatment (PET) process after the etch process of forming the recess.

28. The method of claim 12, comprising stripping the nitride film spacers using a wet chemical solution containing $NH_3F+HF$ and $H_3PO_4$.

29. The method of claim 12, comprising forming the floating gate films by a self-aligned method comprising forming a polysilicon layer on the resulting surface in which the tunnel oxide film is formed and polishing the polysilicon layer by a chemical mechanical polishing (CMP) process until top surfaces of the isolation films are sufficiently exposed.

30. The method of claim 12, comprising performing the process of stripping the projected portions of the isolation films using a wet chemical solution of $H_2O+HF$ and $NH_4OH+H_2O_2+H_2O$.

* * * * *